(12) United States Patent
Suzuki et al.

(10) Patent No.: US 6,372,998 B1
(45) Date of Patent: Apr. 16, 2002

(54) ELECTRICAL COMPONENT CONNECTING STRUCTURE OF WIRING BOARD

(75) Inventors: Masataka Suzuki; Hiroyuki Ashiya; Yayoi Maki, all of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/685,878

(22) Filed: Oct. 11, 2000

(30) Foreign Application Priority Data

Nov. 5, 1999 (JP) ............................................. 11-315963

(51) Int. Cl.[7] ................................................. H05K 1/16
(52) U.S. Cl. ........................ 174/260; 174/258; 174/261; 174/262; 361/760; 361/743; 361/775; 361/803
(58) Field of Search ............................... 174/260, 258, 174/261, 262, 255, 263, 52.4, 265, 760, 266, 264; 361/760, 792, 743, 775, 779, 803, 809, 773, 704

(56) References Cited

U.S. PATENT DOCUMENTS

| | | | |
|---|---|---|---|
| 2,912,745 A | * 11/1959 | Steigerwalt et al. | 29/849 |
| 2,912,748 A | * 11/1959 | Gray | 29/849 |
| 3,013,188 A | * 12/1961 | Kohler | 361/774 |
| 3,190,953 A | * 6/1965 | Keller | 174/262 |
| 3,573,707 A | * 4/1971 | Reynolds | 174/263 |
| 4,086,426 A | * 4/1978 | Knappenberger | 174/261 |
| 4,088,828 A | * 5/1978 | Yamamoto et al. | 174/263 |
| 4,628,409 A | * 12/1986 | Thompson et al. | 361/771 |
| 5,281,770 A | * 1/1994 | Kamei et al. | 174/261 |

FOREIGN PATENT DOCUMENTS

JP           11-40035           2/1999

* cited by examiner

Primary Examiner—Albert W. Paladini
Assistant Examiner—I B Patel
(74) Attorney, Agent, or Firm—Finnnegan, Henderson, Farabow, Garrett & Dunner, L.L.P.

(57) ABSTRACT

An electrical component connecting structure for an electrical component having a terminal is disclosed. The electrical component connecting structure comprises an insulating plate and a bus bar. The insulating plate comprises a first surface side for mounting the electrical component thereon and a second surface side. The insulating plate further comprises an opening portion formed at a predetermined position and defined by an inner wall extending from the first surface side to the second surface side. The bus bar comprises a pattern portion, an insertion plate portion, and a connecting plate portion. The insertion plate portion extends from the pattern portion to the second surface side of the insulating plate along at least part of the inner wall of the opening portion. The connection plate portion extends from the insertion plate portion so as to close the opening portion on the second surface side of the insulating plate. The connection plate portion includes a surface facing away from the opening portion to be soldered to a portion of the terminal of the electrical component projecting outside the bus bar through the connection plate portion.

7 Claims, 3 Drawing Sheets

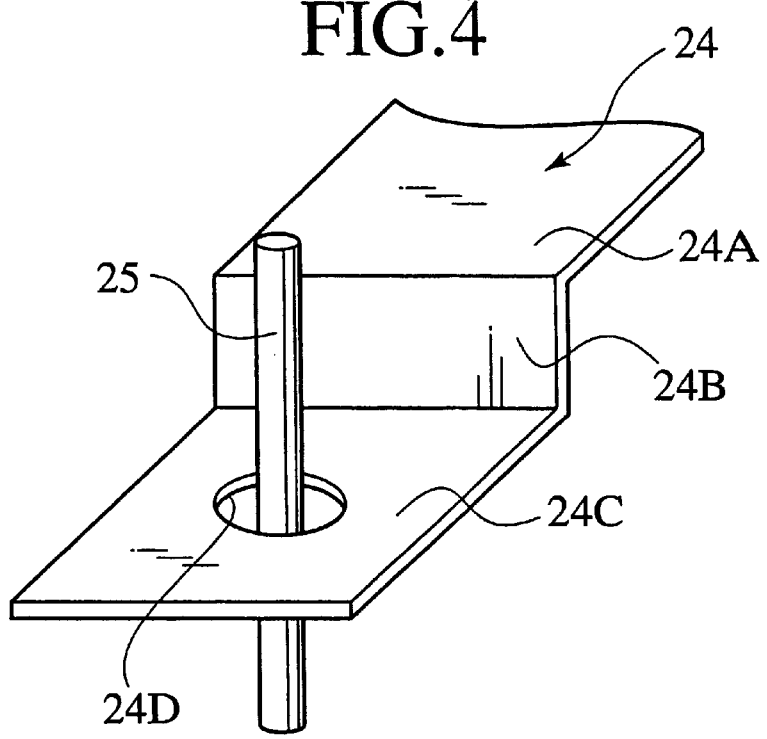
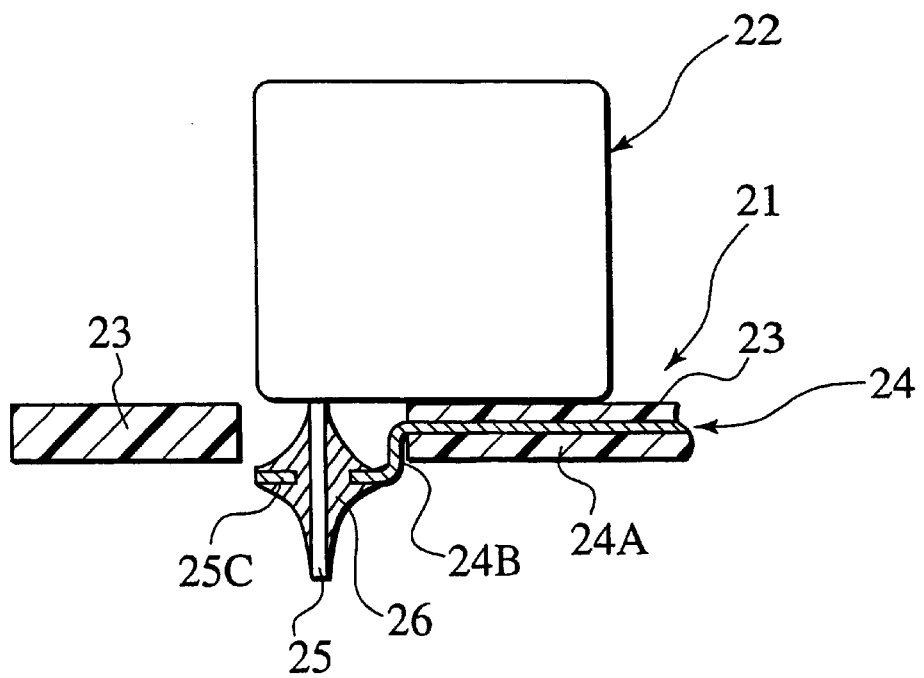

ELECTRICAL COMPONENT CONNECTING STRUCTURE OF WIRING BOARD

BACKGROUND OF THE INVENTION

1. Field of the Invention

The present invention relates to a radiation-mounting structure of an electrical component having a heat generating property such as a relay or the like and a method for mounting an electrical component.

2. Description of the Related Art

Conventionally, because an electrical component or part using a large current such as a relay has a large calorific value, when the component is mounted on a board using normal eutectic soldering, deterioration of the soldered portion is remarkable.

Therefore, such means has been employed that a large current electrical component is mounted on a board with a resin-molded wire conductor through soldering, or high temperature solder is used or a radiating plate is provided when a normal board is used. Particularly, as the connecting structure of an electrical component, one which has been disclosed in Japanese Patent Application Laid-Open (JP-A) No. 11-40035 publication has been known. This art relates to a controller with a built-in relay, and a lead frame 1 made of a metal plate as a mounting board is used as a wire conductor. As illustrated in FIG. 1, in this conventional art, resin plates 2 and 3 are provided to sandwich the lead frame 1. Also, a burring portion 4 projecting downward in a substantially cylindrical shape is provided so as to penetrate the resin plate 3.

For example, a terminal 5A of a relay 5 is inserted in the burring portion 4 from the above of the resin plate 2, and the wire conductor and the relay 5 are connected to each other by filling solder 6 in the burring portion 4.

The solder 6 in a molten state is sucked up in the burring portion 4 by capillarity to be hardened. However, in the electrical component connecting structure, there is a drawback that the solder 6 which has been filled in the burring portion 4 can not be confirmed externally.

In view of the above, an electrical component connecting structure as shown in FIG. 2 has been employed. In this electrical component connecting structure, molded resin layers 8 and 9 are provided on a surface and a back surface of a bus bar 7 made of a metal plate, and the bus bar 7 at a position for mount/connection of an electrical component is exposed from the molded resin layers 8 and 9. A connecting hole 7A for insertion of a terminal 10 of an electrical component is formed at the portion of the bus bar 7 which has been exposed. FIG. 2 shows a state where a solder fillet 11 has been formed in a state where the terminal 10 of the electrical component has been inserted into the connecting hole 7A formed at the bus bar 7.

However, when dipping in a flow solder bath is performed in a state where the terminal 10 of the electrical component has been inserted in the connecting hole 7A formed in the bus bar 7, there occurs a problem that it is difficult to perform soldering in a normal flow solder bath due to that thermal capacity of the bus bar 7 is too large.

SUMMARY OF THE INVENTION

In view of the above, an object of the present invention is to provide an electrical component connecting structure of a wiring board where soldering work can be performed easily and which has a high reliability of connection.

According to a first aspect of the present invention, there is provided an electrical component connecting structure of a wiring board, where an electrical component is mounted on a surface side of a wiring board where an opening portion is formed at a predetermine position on an insulating material layer and a bus bar is provided along the insulating material layer, and a terminal of the electrical component and the bus bar facing the opening portion are soldered to each other, wherein the bus bar positioned so as to face the opening portion is formed with an insertion plate portion extending to a back surface of the wiring board along an inner wall of the opening portion and a connection plate portion, and the terminal and the connection plate portion are soldered at least at a back face side of the connection plate portion in a state where the terminal of the electrical component has penetrated the connection plate portion.

According to this arrangement, the bus bar arranged along the insulting material layer is led to the back surface side of the insulating material layer along the opening portion thereof, and the terminal of the electrical component is soldered to the connection plate portion formed at an end portion of the bus bar in a state where the terminal has penetrated the connection portion. Since the bus bar and the terminal of the electrical component are soldered at least between the back surface of the connection plate portion and the terminal which has penetrated the connection plate portion, electrical connection is securely performed. Also, in this manner, since the soldering is performed at least at the back face side of the connection plate portion, inspection about whether or not the soldering has been performed properly can be performed easily and securely. Furthermore, since the soldering is performed on the connection plate portion extending from the bus bar facing the opening portion, the soldered portion can be suppressed from being adversely affected by heating only the connection plate portion due to the magnitude of heat capacity of the bus bar.

Also, according to a second aspect of the invention, there is provided an electrical component connecting structure according to the first aspect, wherein the connection plate portion projects from the opening portion outside the back face thereof.

Accordingly, since the connection plate portion projects outside the back face of the opening portion, it becomes possible to confirm with eyes whether or not the connection plate portion and the terminal of the electrical component have been securely soldered to each other. In a case that the connection plate portion and the terminal are soldered to each other, since the connection plate portion and the terminal can securely be dipped in a flow solder bath, the temperature of the connection plate portion is increased up to that of the solder or so in a short time so that soldering work can be performed rapidly.

Furthermore, according to a third aspect of the invention, there is provided an electrical component connecting structure according to the first or second aspect, wherein the connection plate portion is formed with an opening portion for terminal connection which the terminal penetrates. Thereby, soldering work can be performed in a state where the terminal of the electrical component has been inserted into the opening portion for terminal connection formed at the connection plate portion. In this case, since molten solder also attaches to a surface side of the connection plate portion by capillarity from a gap between the opening portion for terminal connection and the terminal, the connection plate portion can be soldered at its surface and back surface to the terminal.

According to a fourth aspect of the invention, there is provided an electrical component connecting structure according to one of the first to third aspects, wherein the insulating material layer is an insulating plate formed of insulating resin. Therefore, since the bus bar may be assembled along the insulating plate, manufacturing of a wiring board can be facilitated.

Furthermore, according to fifth aspect of the invention, there is an electrical component connecting structure according to one of the first to third aspects, wherein the wiring board is formed by insert-molding the bus bar with insulating resin. Accordingly, since the bus bar is formed by insert-molding with insulating resin, the electrically insulating property of the bus bar can be improved. For this reason, reliability of connection of an electrical component to a wiring board can be improved.

BRIEF DESCRIPTION OF THE DRAWINGS

FIG 4. is a perspective view showing a relationship between a bus bar and a terminal of the first embodiment; and FIG. 5 is a sectional view showing a main portion of a second embodiment of an electrical component connecting structure according to the present invention.

DESCRIPTION OF THE PREFERRED EMBODIMENT

Figure 1:
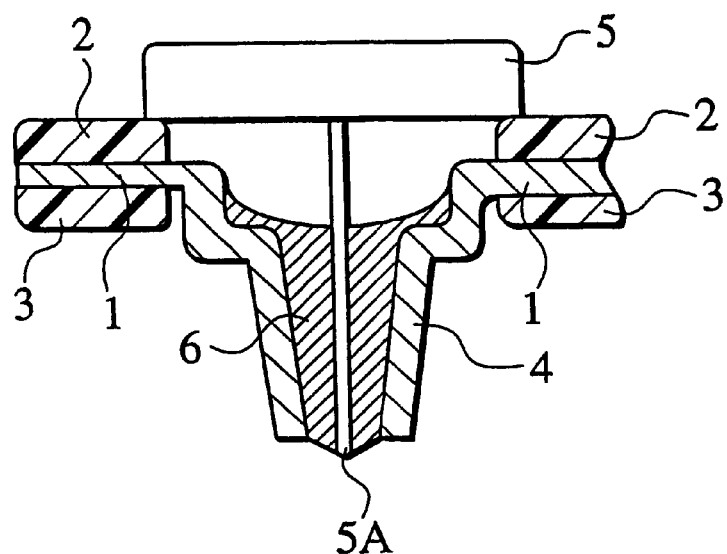
FIG. 1 is a sectional view showing a main portion of a conventional electrical component connecting structure.
Figure 2:
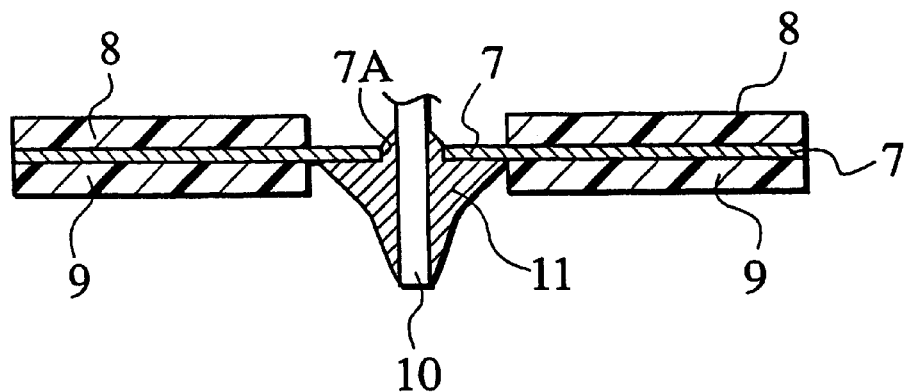
FIG. 2 is a sectional view showing a main portion of another conventional electrical component connecting structure.

Detail of an electrical component connecting structure of a wiring board according to the present invention will be explained below with reference to embodiments shown in the drawings.

Figure 3:
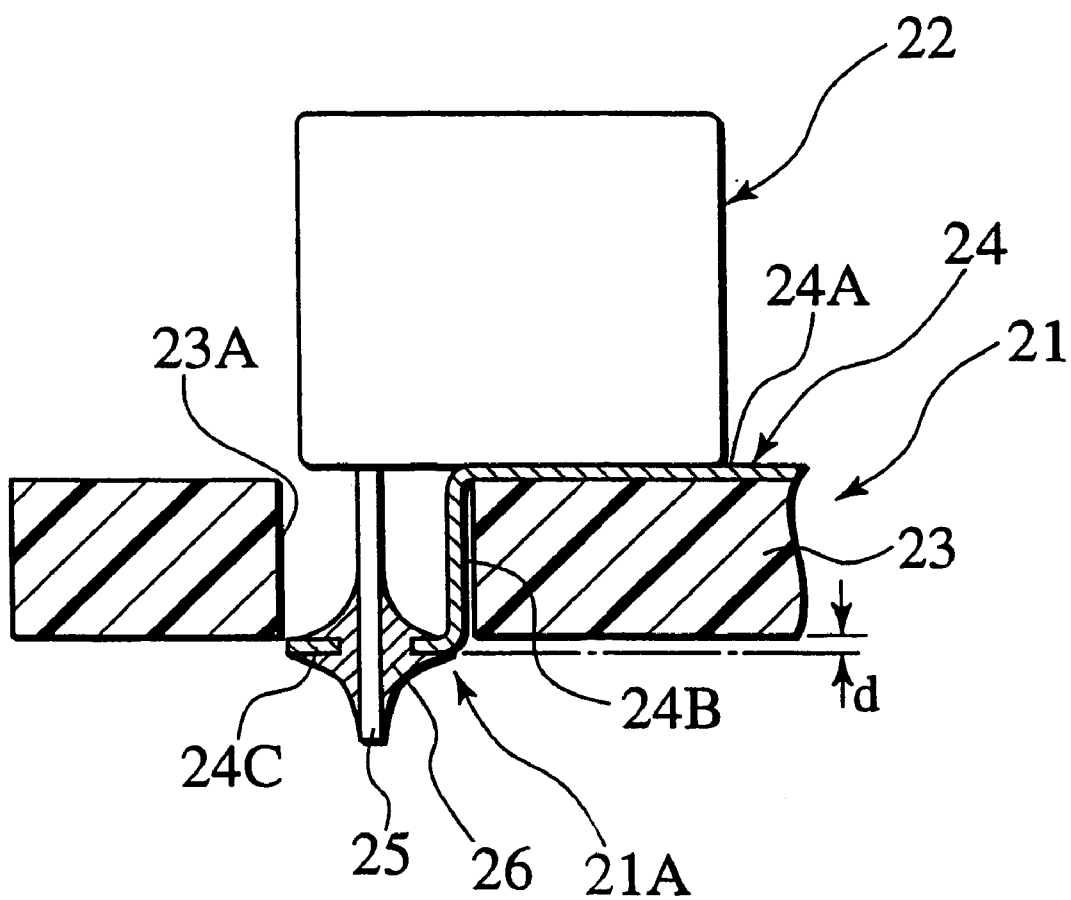
FIG. 3 is a sectional view showing a main portion of a first embodiment of an electrical component connecting structure according to the present invention.

FIGS. 3 and 4 are respectively a main portion sectional view and a perspective view showing a first embodiment of an electrical component connecting structure according to the present invention. As shown in these figures, the electrical component connecting structure is applied to a portion of a wiring board 21 to which an electrical component 22 is connected/mounted. The wiring board 21 comprises an insulating plate 23 made of resin material having an insulating property, and a bus bar 24 with a predetermined shape disposed along a surface of the insulating plate 23. One or plural connection portions 21A are provided in the wiring board 21. In the structure of the connection portion 21A, an opening portion 23A is formed in the insulating plate 23, and the bus bar disposed on a surface of insulating plate 23 is led from the surface side of the insulating plate 23 to the back surface thereof through the opening portion 23A. Incidentally, in the embodiment, the shape of the opening portion 23A in plan view is set to be generally rectangular.

As shown in FIGS. 3 and 4, the bus bar 24 comprises a pattern portion 24A formed along a surface of the insulating plate 23, an insertion plate portion 24B extending from the pattern portion 24A facing the opening portion 23A formed in the insulating plate 23 to a back face side of the insulating plate 23 along an inner wall of the opening portion 23A, and a connection plate portion 24C extending from an edge of the insertion plate portion 24B so as to close the back surface side of the opening portion 23A. The insertion plate portion 24B and the connection plate portion 24C are formed at each of the plural opening portions 23A opened in the insulating plate 23. As shown in FIG. 4, an generally circular opening portion 24D for terminal connection is formed at an approximately central portion of the connection plate portion 24C. The diameter of the opening portion 24D for terminal connection is set to be larger than that of a terminal 25 of the electrical component 22, and it may be set properly according to the property of solder for connecting the terminal 25 and the connection plate portion 24C.

In this embodiment, the length of the insertion plate portion 24B extending from the surface side of the insulating plate 23 to the back surface thereof is set to be slightly longer than the thickness of the opening portion 23A. For this reason, as shown in FIG. 3, the connection plate portion 24C projects from the opening portion 23A to the back surface side by a dimension d. Also, the insertion plate portion 24B and the connection plate portion 24C are formed by an embossing or projecting work. The bus bar 24 thus structured is subjected to pattern-forming by cutting work and forming of the insertion plate portion 24B and the connection plate portion 24C by the embossing work before it is assembled to the insulating plate 23. The insulating plate 23 and the bus bar 24 are joined to each other in a state where the insertion plate portion 24B and the connection plate portion 24C have been inserted into the opening portion 23A.

As shown in FIG. 3, the electrical component 22 is connected to the wiring board 21 such that the connection plate portion 24C and the terminal 25 are connected to each other via a solder fillet 26. In order to mount the electrical component 22 on the wiring board 21 in this manner, as shown in FIG. 4, the soldering is performed by dipping in a flow solder bath in a state where the terminal 25 of the electrical component 22 has been inserted in the opening portion 24D for terminal connection of the connection plate portion 24C from the surface side of the wiring board 21. Incidentally, FIG. 4 shows a state where the bus bar 24 is not assembled to the insulating plate 23.

Since the first embodiment has such a structure that the connection plate portion 24C projects from the opening portion 23A on the back surface side, a confirmation can be made by visual inspection about whether or not the solder fillet 26 is securely attached to the terminal 25 and the connection plate portion 24C. Also, since the solder fillet 26 is securely formed on upper and lower surfaces of the connection plate portion 24C, the soldering can be performed with a high reliability.

Also, in the first embodiment, the connection plate portion 24C which is to be soldered and the insertion plate portion 24B are formed by performing an embossing work on the bus bar 24 so that the thermal conduction area between the solder and the connection plate portion 24C can be reduced, thereby restricting leakage of heat flow from the connection plate portion to a portion of the bus bar 24 which has a large heat capacity. As a result, only the soldering portion is heated so that bad soldering is prevented from occurring due to poor temperature or a non-uniform temperature distribution.

Since an electrical component and its terminal, a bus bar and the like generate heat caused by large current conduction, stress due to expansion/contraction caused by temperature change in members related thereto acts on the soldered portion. According to the present invention, such a stress is absorbed by the elastic force of the portion (the insertion plate portion 24B and the connection plate portion 24C) of the bus bar 24 which has been subjected to the embossing work, so that the stress acting on the soldered portion can be reduced. For this reason, the solder fillet 26 can effectively be prevented from being adversely affected by heat generation of the related members due to a large current conduction.

FIG. 5 shows a second embodiment of an electrical component connecting structure of a wiring board according to the present invention. In the second embodiment, the pattern portion 24A of the bus bar 24 is insert-molded in the insulating plate 23. In this embodiment, the other structures are substantially the same as those of the first embodiment.

In the second embodiment, since a surface and a back surface of the pattern portion 24A of the bus bar 24 are molded with resin, insulation of the pattern portion 24A can be secured. For this reason, it is possible to secure insulation between the electrical component 22 mounted on the wiring board 21 and the pattern portion 24A sufficiently.

Though the first and second embodiments have been explained in the above, the present invention is not limited to these embodiments and various modifications may be made on the embodiments according to the spirit of the structure. For example, in the above first and second embodiments, the connection plate portion 24C has been set to project outside the opening portion 23A but it may be positioned within the opening portion 23A. Even in this case, it is possible to inspect the soldered portion with eyes.

Also, in the above first embodiment, the bus bar 24 has been subjected to embossing work before it is assembled to the insulating plate 23. In the present invention, however, according to the material of the insulating plate 23, the embossing work may be performed on the bus bar 24 after the bus bar 24 has been joined or bonded to the insulating plate 23. Incidentally, the shaping work of the bus bar 24 is not limited to the embossing work, but another work such as a bending work or the like is applicable to the bus bar 24.

Furthermore, in the first and second embodiments, the opening portion 23A has been set to be rectangular, but it may be set to be circular. Also, the insertion plate portion 24B and the connection plate portion 24C have been configured so as to form a L-shape, but a channel shape structure where the connection plate portion 24C is formed between edges of two opposed insertion plate portions may be employed in the present invention.

As apparent from the above explanation, according to the first aspect of the present invention, since a bus bar and a terminal of an electrical component are connected to each other by performing soldering between a back surface of a connection plate portion of the bus bar and the terminal which has penetrated the connection plate portion, such an effect can be obtained that electrical connection can be made securely. Also, since the soldering is performed at least on the back surface side of the connection plate portion, such an effect can be obtained that an inspection about whether or not soldering has been performed suitably can be made easily and securely. Furthermore, since the soldering is performed on the connection plate portion extending from a portion of the bus bar which faces the opening portion, only the connection plate portion is heated during soldering work so that the soldered portion can be suppressed from being adversely affected due to the magnitude of heat capacity of the bus bar.

Also, according to the second aspect of the present invention, since the connection plate portion projects outside the back surface of the opening portion, a confirmation can easily be made with eyes about whether or not the connection plate portion and the terminal of the electrical component have been securely soldered to each other. Also, when the connection plate portion and the terminal are soldered to each other, such an effect can be obtained that the connection plate portion can be dipped in a flow solder bath.

According to the third aspect of the present invention, the soldering can easily be performed in the state where the terminal of the electrical component has been inserted in the opening portion for terminal connection formed in the connection plate portion. Also, since molten solder adheres to even the surface side of the connection plate portion by capillarity from a gap between the opening portion for terminal connection and the terminal, the soldering can be performed between the terminal, and the surface and the back surface of the connection plate portion, and the connection between the terminal and the connection plate portion can be securely performed.

What is claimed is:

1. An electrical component connecting structure for an electrical component having a terminal, comprising:

an insulating plate comprising a first surface side for mounting the electrical component thereon and a second surface side, the insulating plate further comprising an opening portion formed at a predetermined position, the opening portion being defined by an inner wall extending from the first surface side to the second surface side; and a bus bar comprising a pattern portion, an insertion plate portion extending from the pattern portion to the second surface side of the insulating plate along at least part of the inner wall of the opening portion, and a connection plate portion extending from the insertion plate portion so as to close the opening portion on the second surface side of the insulating plate, wherein the connection plate portion includes a surface facing away from the opening portion to be soldered to a portion of the terminal of the electrical component projecting outside the bus bar through the connection plate portion.

2. An electrical component connecting structure according to claim 1, wherein the connection plate portion projects from the opening portion outside the second surface of the insulating plate.

3. An electrical component connecting structure according to claim 2, wherein the connection plate portion is formed with an opening portion through which the terminal of the electrical component projects outside the bus bar.

4. An electrical component connecting structure according to any one of claims 1 to 3, wherein the insulating plate is formed of insulating resin.

5. An electrical component connecting structure according to any one of claims 1 to 3, wherein the pattern portion of the bus bar is insert-molded in the insulating plate.

6. An electrical component connecting structure according to any one of claims 1 to 3, wherein the pattern portion of the bus bar is formed along the first surface side of the insulating plate.

7. An electrical component connecting structure according to claim 1, wherein the surface of the connection plate portion facing away from the opening portion is parallel with the second surface side of the insulating plate.

* * * * *